(12) United States Patent
Lee

(10) Patent No.: US 7,378,295 B2
(45) Date of Patent: May 27, 2008

(54) CMOS IMAGE SENSOR AND FABRICATING METHOD THEREOF

(75) Inventor: Sang Gi Lee, Bucheon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 29 days.

(21) Appl. No.: 11/319,477

(22) Filed: Dec. 29, 2005

(65) Prior Publication Data

US 2006/0145216 A1  Jul. 6, 2006

(30) Foreign Application Priority Data

Dec. 30, 2004  (KR) ............... 10-2004-0116428

(51) Int. Cl.
*H01L 21/00* (2006.01)

(52) U.S. Cl. .............. 438/69; 438/70; 257/291; 257/292

(58) Field of Classification Search ........ 257/290, 257/292, 291, 294, 461, 213, 288, 414, 428, 257/431, 435, E27.132, E27.133, E27.134, 257/E27.142; 438/69, 48, 57, 72, 74, 75, 438/76, 77, 78, 79, 80, 81
See application file for complete search history.

(56) References Cited

U.S. PATENT DOCUMENTS

| 5,324,623 | A | * | 6/1994 | Tsumori | 430/321 |
| 6,577,342 | B1 | * | 6/2003 | Wester | 348/340 |
| 6,737,626 | B1 | * | 5/2004 | Bidermann et al. | 250/208.1 |
| 2004/0038443 | A1 | * | 2/2004 | Jiao | 438/73 |
| 2006/0141660 | A1 | * | 6/2006 | Lee | 438/70 |

FOREIGN PATENT DOCUMENTS

KR  10-2003-0001066 A  1/2003

* cited by examiner

*Primary Examiner*—Paul E Patton
(74) *Attorney, Agent, or Firm*—McKenna Long & Aldridge LLP

(57) ABSTRACT

A CMOS image sensor and fabricating method thereof enable enhanced photo-response characteristics and protect a microlens in packaging by embedding the microlens in a passivation layer pattern. The image sensor may include a semiconductor substrate, a photodiode, a metal line, an insulating layer, a passivation layer pattern, and a microlens formed to be embedded in the passivation layer pattern.

6 Claims, 6 Drawing Sheets

CMOS IMAGE SENSOR AND FABRICATING METHOD THEREOF

This application claims the benefit of Korean Patent Application No. 10-2004-0116428, filed on Dec. 30, 2004, which is hereby incorporated by reference for all purposes as if fully set forth herein.

BACKGROUND OF THE INVENTION

1. Field of the Invention

The present invention relates to a CMOS image sensor and fabricating method thereof. Although the present invention is suitable for a wide scope of applications, it is particularly suitable for enhancing photo-response characteristics and protecting a microlens in packaging by embedding the microlens in a passivation layer pattern.

2. Discussion of the Related Art

An image sensor is a semiconductor device that converts an optical image to an electric signal. Image sensors can be classified into charge coupled devices (CCD) and CMOS (complementary metal oxide silicon) image sensors. In a CCD image sensor, a plurality of MOS (metal-oxide-metal) capacitors are arranged close to one another to transfer and store electric charge carriers. In a CMOS (complementary MOS) image sensor, a plurality of MOS transistors corresponding to the number of pixels are fabricated by CMOS technology using a control circuit and a signal processing circuit as peripheral circuits. A switching system of sequentially detecting outputs using the MOS transistors is also adopted.

Microlenses of the related art CMOS image sensor are formed on a passivation layer; thus, the microlenses are vulnerable to packaging. Hence, photo-response characteristics of the CMOS image sensor are degraded and overall process throughput is lowered.

A CMOS image sensor and fabricating method thereof according to a related art are explained with reference to the attached drawing as follows.

FIG. 1 is a cross-sectional diagram of a CMOS image sensor according to a related art.

Referring to FIG. 1, a photodiode 11 is formed on a semiconductor substrate 10. A first insulating layer 12 is formed on the semiconductor substrate 10 including the photodiode 11. A via hole 13 is formed by selectively etching the first insulating layer 12. A metal layer is deposited on the first insulating layer 12 including the via hole 13 and is then patterned to form a metal line 16 in a pixel area 14 and a pad 17 in a peripheral area 15. A second insulating layer 18 is formed of a material for interlayer insulation, such as oxide, etc., on the first insulating layer 12 including the metal line 16 and the pad 17. The second insulating layer 18 is then planarized.

A passivation insulating layer 19 may be formed of nitride. The passivation insulating layer 19 is planarized by CMP (chemical mechanical polishing) and is then selectively etched to form an opening 21 on the pad 17. A microlens material layer (not shown) is formed on the passivation insulating layer 19. A photoresist layer (not shown) is coated on the microlens material layer. The photoresist layer is patterned to form a photoresist pattern (not shown). The microlens material layer is selectively etched to form a microlens material layer pattern (not shown) using the photoresist pattern as a mask. Reflowing is carried out on the microlens material layer pattern by baking to form a spherical microlens 20.

However, the related art CMOS image sensor and fabricating method thereof have disadvantages. Since the microlens is formed on the passivation layer, the microlens can be damaged in subsequent packaging. Hence, a photo-response characteristic of a device is degraded and process throughput is lowered.

SUMMARY OF THE INVENTION

Accordingly, the present invention is directed to a CMOS image sensor and fabricating method thereof that substantially obviate one or more problems due to limitations and disadvantages of the related art.

An advantage of the present invention is to provide a CMOS image sensor and fabricating method thereof, in which a microlens is formed between patterns of a passivation layer.

Another advantage of the present invention is to provide a CMOS image sensor and fabricating method thereof, by which damaging of the microlens in a subsequent packaging can be prevented.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described, a CMOS image sensor includes a semiconductor substrate, a photodiode in the semiconductor substrate, a metal line over the semiconductor substrate that electrically connects to the photodiode, an insulating layer on the semiconductor substrate that insulates the metal line, a passivation layer pattern on the insulating layer, and a microlens on the insulating layer that is embedded in the passivation layer pattern.

In another aspect of the present invention, a method of fabricating a CMOS image sensor includes the steps of forming a photodiode in a semiconductor substrate, forming a first insulating layer on the semiconductor substrate, forming a metal line on the first insulating layer for electrically connecting to the photodiode, forming a second insulating layer on an entire surface of the first insulating layer including the metal line, forming a passivation layer pattern on the second insulating layer, and forming a microlens on the second insulating layer such that the microlens is embedded in the passivation layer pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1:
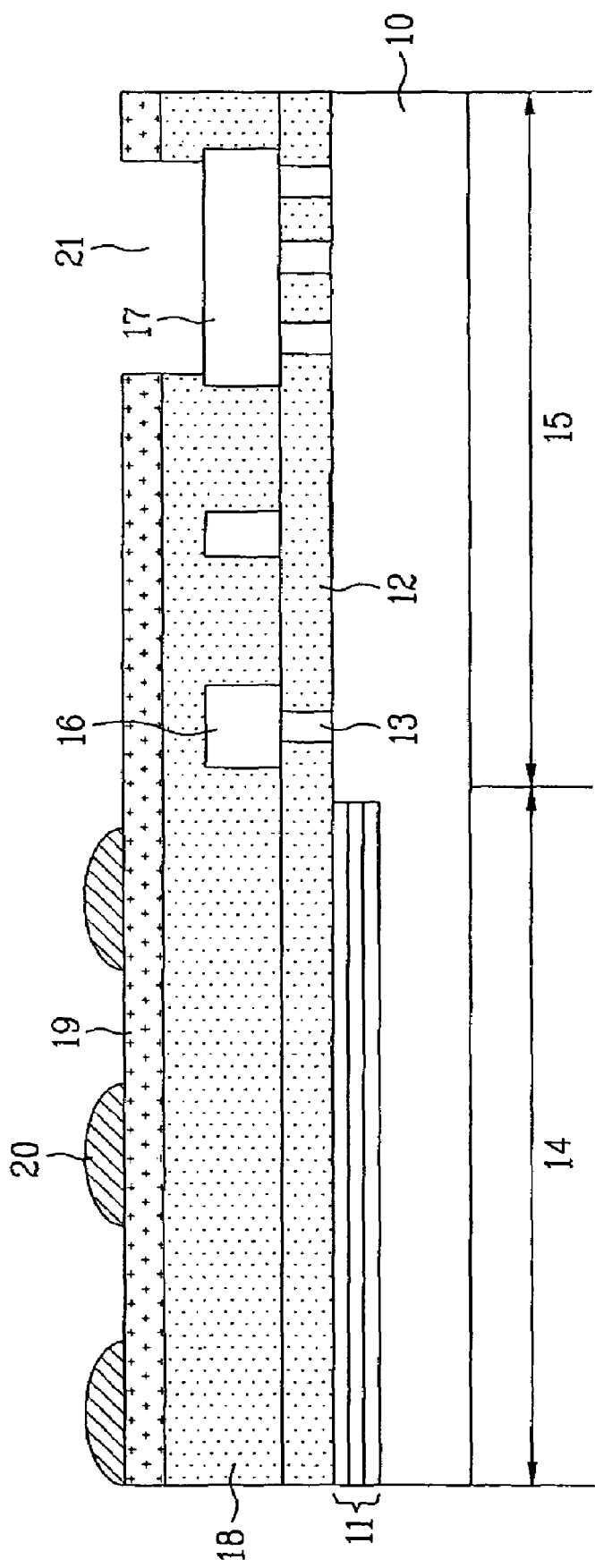
FIG. 1 is a cross-sectional diagram of a CMOS image sensor according to a related art.
Figure 2A:
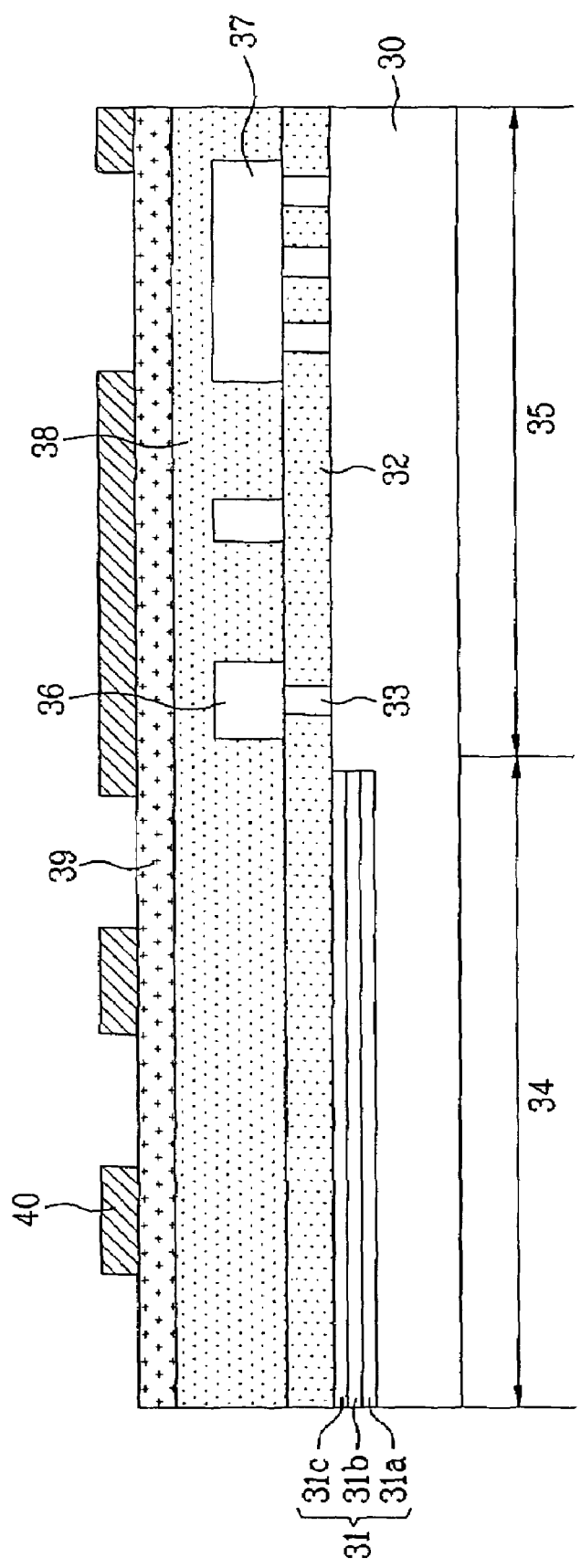
FIGS. 2A to 2E are cross-sectional diagrams of a CMOS image sensor fabricated by a method according to an embodiment of the present invention.

Referring to FIG. 2A, a photodiode 31 is formed on a semiconductor substrate 30. The photodiode 31 includes red, green and blue photodiodes 31a, 31b and 31c that are vertically stacked on the semiconductor substrate 30. A first insulating layer 32 is formed on the semiconductor substrate 30 including the photodiode 31. A via hole 33 is formed by selectively etching the first insulating layer 32. A metal layer is deposited on the first insulating layer 32 including the via hole 33 and is then patterned to form a metal line 36 in a pixel area 34 and a pad 37 in a peripheral area 35. A second insulating layer 38 is formed of a material for interlayer insulation, such as oxide, etc., on the first insulating layer 32 including the metal line 36 and the pad 37. A passivation layer 39 is formed of nitride on the second insulating layer 38.

A first photoresist layer (not shown) is coated on the passivation layer 39. Exposure and development are performed on the first photoresist layer to form a first photoresist pattern 40 to expose portions of the passivation layer 39 corresponding to a microlens forming area and the pad 37, respectively.

Figure 2B:
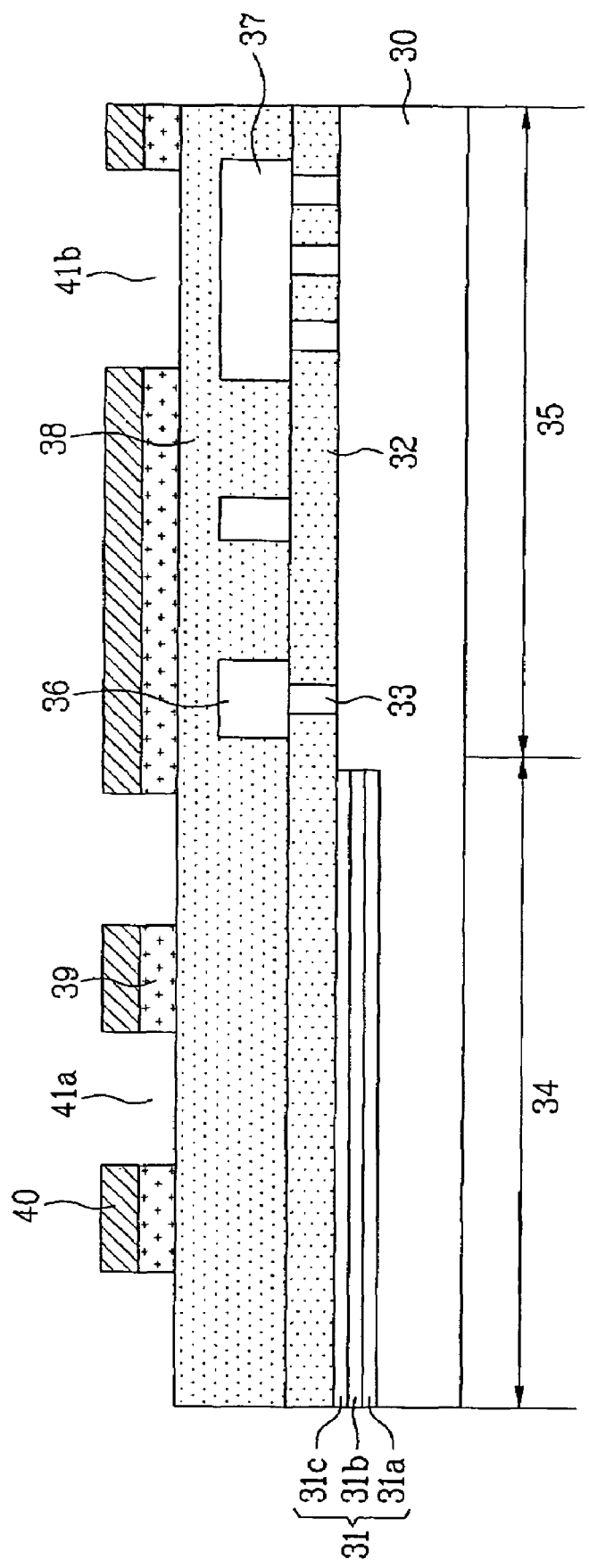

Referring to FIG. 2B, the passivation layer 39 is selectively removed using the first photoresist pattern 40 as a mask to form a first opening 41a on the microlens forming area and a second opening 41b over the pad 37.

Figure 2C:
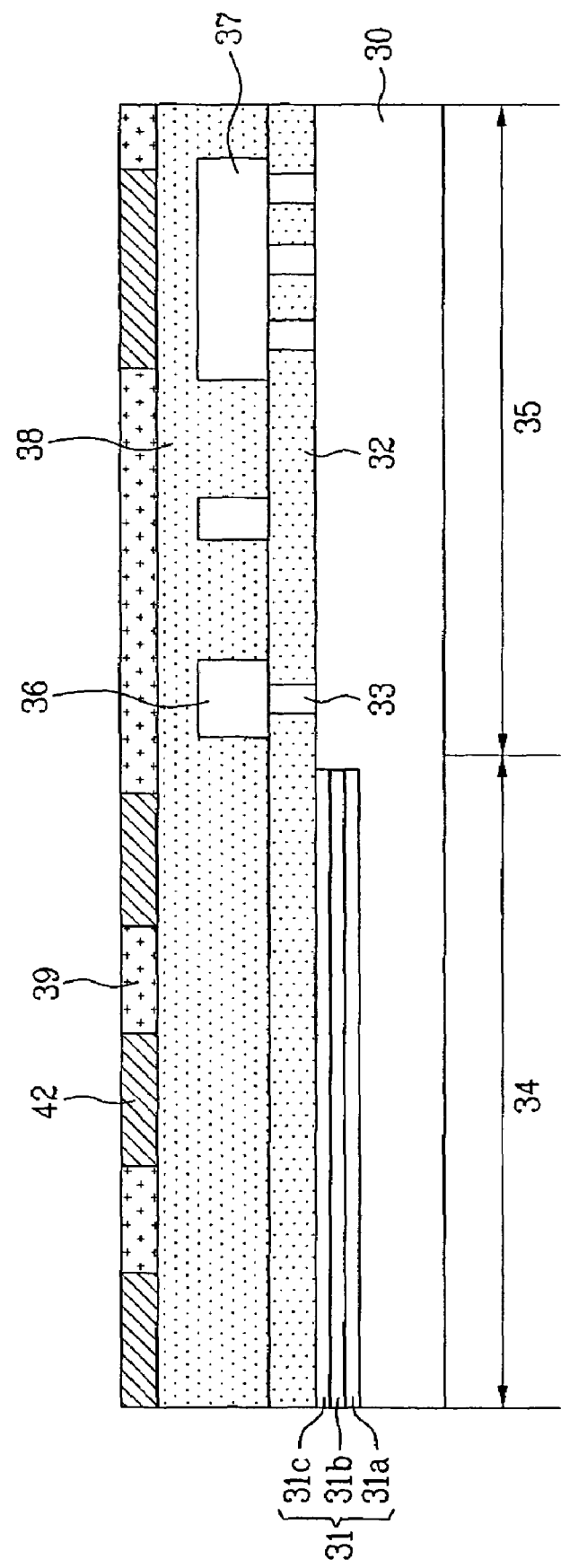

Referring to FIG. 2C, the first photoresist pattern 40 is removed. A microlens forming material layer (not shown) is formed on the passivation layer 39 including the first and second openings 41a and 41b. The microlens forming material layer is then planarized until an upper surface of the passivation layer 39 is exposed. Hence, a microlens material layer pattern 42 is formed within each of the first and second openings 41a and 41b.

Figure 2D:
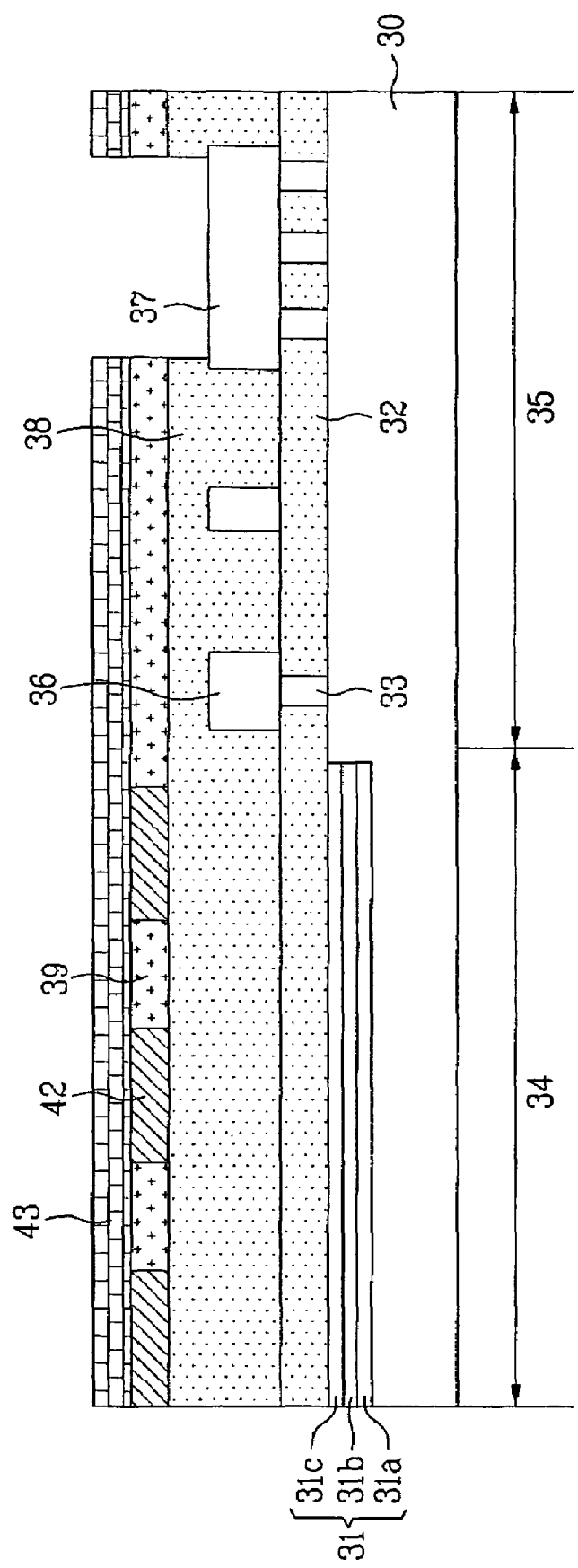

Referring to FIG. 2D, a second photoresist layer (not shown) is coated on the passivation layer 39 including the microlens material layer patterns 42 and is then patterned to form a second photoresist pattern 43 using a pad mask (not shown). The microlens material layer pattern 42 and the second insulating layer 38 are selectively etched using the second photoresist pattern 43 as a mask until an upper surface of the pad 37 is exposed.

In an exemplary embodiment, the second opening 41b is formed by etching the portion of the passivation layer 39 corresponding to the pad area and the microlens material layer pattern is formed in the second opening 41b. The second opening 41b may be omitted. Since the portion of the passivation layer 39 corresponding to the pad area remains intact, the targets of the selective etch are the passivation layer 39 and the second insulating layer 38. Selective etching of these layers exposes the pad 37 using the second photoresist pattern 43 as a mask.

Figure 2E:
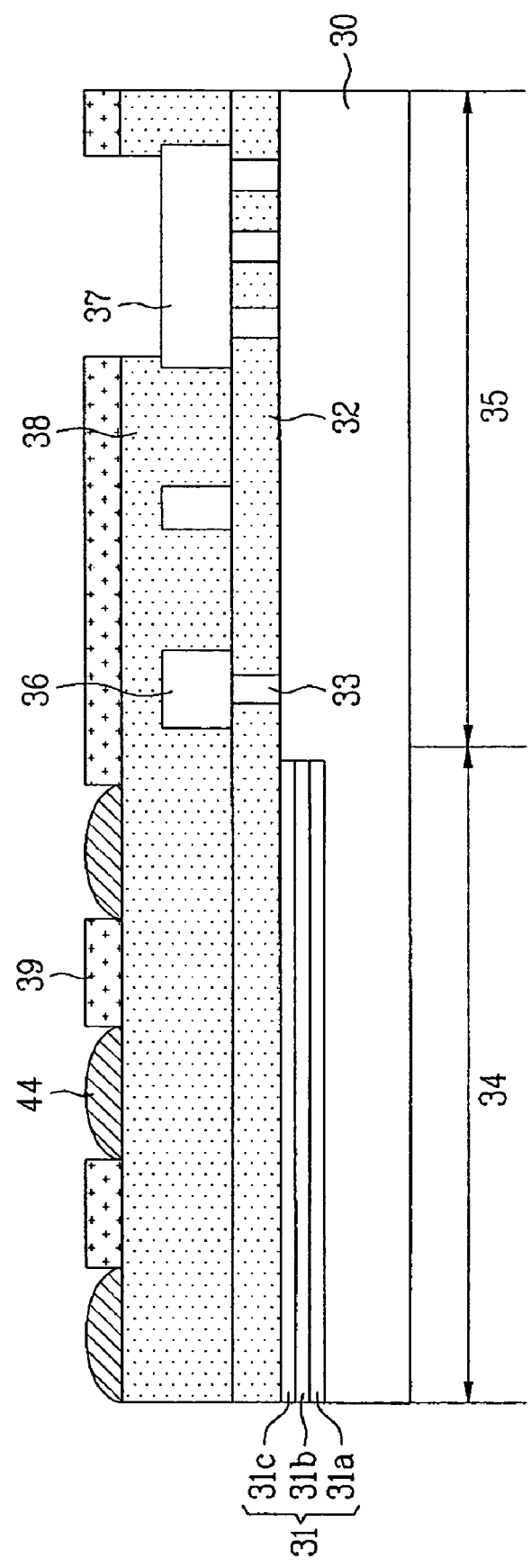

Referring to FIG. 2E, the second photoresist pattern 43 is removed. A spherical microlens 44 is formed by performing reflowing on the microlens material layer pattern 42 at an appropriate temperature. The passivation layer 39 and the microlens 44 do not overlap each other.

By forming the self-aligned microlens 44 to be embedded in the passivation layer 39, a space margin between the microlenses 44 can be accurately secured to raise photo-efficiency.

The present invention provides the following effects. The self-aligned microlenses may be accurately arranged in a photo-shield layer to raise photo-efficiency. Also, the microlens is embedded in the passivation layer such that it is prevented from being damaged in packaging. Hence, photo-response characteristics of the device can be enhanced and the process throughput can be raised.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a CMOS image sensor, comprising the steps of:

forming a photodiode in a semiconductor substrate;

forming a first insulating layer on the semiconductor substrate;

forming a metal line on the first insulating layer for electrically connecting to the photodiode;

forming a second insulating layer on an entire surface of the first insulating layer including the metal line;

forming a passivation layer pattern and a microlens material layer pattern on the second insulating layer such that the microlens material layer pattern is embedded between the passivation layer pattern;

forming a photoresist pattern on the passivation layer pattern and the microlens material layer pattern;

forming an opening by selectively performing an etching using the photoresist pattern as a mask until an upper surface of a metal pad is exposed and removing the photoresist pattern; and forming a microlens by performing reflowing on the microlens material layer pattern.

2. The method of claim 1, wherein forming the passivation layer pattern and the microlens material layer pattern comprises the steps of:

forming a passivation layer on the second insulating layer;

forming the passivation layer pattern on the second insulating layer by selectively etching a portion of the passivation layer corresponding to an area for forming the microlens;

forming a microlens material layer on the second insulating layer including the passivation layer pattern;

forming the microlens material layer pattern embedded between the passivation layer pattern by planarizing the microlens material layer until an upper surface of the passivation layer pattern is exposed.

3. The method of claim 1, wherein forming the photodiode comprises the step of sequentially forming red, green and blue photodiodes within the semiconductor substrate in a vertical manner.

4. The method of claim 1, wherein the first insulating layer and the second insulating layer are formed of oxide.

5. The method of claim 1, wherein the passivation layer pattern comprises a nitride layer.

6. A method of fabricating a CMOS image sensor, comprising the steps of:

forming a photodiode in a semiconductor substrate defined by a pixel area and a peripheral area;

forming a first insulating layer on the semiconductor substrate;

forming a metal line on the first insulating layer of the pixel area and forming a metal pad on the first insulating layer of the peripheral area;

forming a second insulating layer on an entire surface of the first insulating layer including the metal line and the metal pad;

forming passivation layer patterns on the second insulating layer;

forming a microlens material layer on the second insulating layer including the passivation layer patterns;

forming microlens material layer patterns embedded between the passivation layer patterns by planarizing the microlens material layer until an upper surface of the passivation layer patterns are exposed;

forming a photoresist pattern on the passivation layer patterns including the microlens material layer patterns in order to expose the metal pad;

selectively etching, in the peripheral area, the microlens material layer pattern and the second insulating layer using the photoresist pattern as a mask until an upper surface of the metal pad is exposed and removing the photoresist pattern; and forming at least one microlens by performing reflowing on the microlens material layer patterns of the pixel area.

\* \* \* \* \*